(12) United States Patent
Takahashi et al.

(10) Patent No.: US 10,431,452 B2
(45) Date of Patent: Oct. 1, 2019

(54) PROTECTIVE FILM FORMING METHOD

(71) Applicant: Tokyo Electron Limited, Tokyo (JP)

(72) Inventors: Yutaka Takahashi, Iwate (JP); Masahiro Murata, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/869,623

(22) Filed: Jan. 12, 2018

(65) Prior Publication Data

US 2018/0204716 A1 Jul. 19, 2018

(30) Foreign Application Priority Data

Jan. 18, 2017 (JP) .................................. 2017-006576

(51) Int. Cl.
*H01L 21/02* (2006.01)
*C23C 16/24* (2006.01)
(Continued)

(52) U.S. Cl.
CPC ...... *H01L 21/0234* (2013.01); *C23C 16/0272* (2013.01); *C23C 16/04* (2013.01); *C23C 16/24* (2013.01); *C23C 16/345* (2013.01); *C23C 16/452* (2013.01); *C23C 16/45534* (2013.01); *C23C 16/45536* (2013.01); *C23C 16/45542* (2013.01); *C23C 16/45551* (2013.01); *H01L 21/0217* (2013.01); *H01L 21/0228* (2013.01); *H01L 21/02211* (2013.01); *H01L 21/02247* (2013.01); *H01L 21/02274* (2013.01);
(Continued)

(58) Field of Classification Search
CPC ........... H01L 21/0234; H01L 21/68771; H01L 21/02329; H01L 21/02247; H01L 21/0217; H01L 21/76224; H01L 21/02252; H01L 21/76831; C23C 16/45536; C23C 16/24
See application file for complete search history.

(56) References Cited

U.S. PATENT DOCUMENTS

| 7,132,134 B2 * | 11/2006 | Rossman | ............... C23C 16/045 427/579 |
| 10,062,579 B2 * | 8/2018 | Chen | ................... H01L 21/0217 |
| 2001/0028922 A1 * | 10/2001 | Sandhu | .................. C23C 16/045 427/255.27 |
| 2005/0090123 A1 * | 4/2005 | Nishimura | .......... C23C 16/4405 438/800 |

(Continued)

FOREIGN PATENT DOCUMENTS

JP 2010-103242 5/2010

*Primary Examiner* — Charles D Garber
*Assistant Examiner* — S M Sohel Imtiaz
(74) *Attorney, Agent, or Firm* — IPUSA, PLLC

(57) ABSTRACT

A protective film forming method is provided. In the method, substantially an entire surface of a silicon-containing underfilm is terminated with fluorine by supplying a fluorine-containing gas to the silicon-containing underfilm formed on a substrate having a surface including a plurality of recesses and a flat surface provided between the adjacent recesses. A surface of the silicon-containing underfilm formed on the flat surface of the substrate is nitrided by supplying a nitriding gas converted to plasma to the silicon-containing underfilm terminated with fluorine such that a silicon adsorption site is formed on the surface of the silicon-containing underfilm formed on the flat surface of the substrate. A silicon-containing gas is adsorbed on the silicon adsorption site by supplying the silicon-containing gas to the silicon-containing underfilm.

20 Claims, 13 Drawing Sheets

(51) Int. Cl.
*C23C 16/455* (2006.01)
*H01L 21/687* (2006.01)
*C23C 16/02* (2006.01)
*C23C 16/04* (2006.01)
*C23C 16/34* (2006.01)
*C23C 16/452* (2006.01)
*H01L 21/768* (2006.01)
*H01L 21/762* (2006.01)

(52) U.S. Cl.
CPC .. *H01L 21/02304* (2013.01); *H01L 21/02312* (2013.01); *H01L 21/02315* (2013.01); *H01L 21/02329* (2013.01); *H01L 21/68764* (2013.01); *H01L 21/68771* (2013.01); *H01L 21/02252* (2013.01); *H01L 21/76224* (2013.01); *H01L 21/76831* (2013.01)

(56) References Cited

U.S. PATENT DOCUMENTS

| | | | |
|---|---|---|---|
| 2012/0052693 A1* | 3/2012 | Ozaki | C23C 16/402 438/771 |
| 2013/0087097 A1* | 4/2013 | Kato | H01J 37/321 118/663 |
| 2013/0095622 A1* | 4/2013 | Jee | H01L 29/7889 438/264 |
| 2014/0179122 A1* | 6/2014 | Tachibana | H01L 21/02148 438/782 |
| 2015/0004332 A1* | 1/2015 | Kato | C23C 16/345 427/579 |
| 2015/0099373 A1* | 4/2015 | Sano | C23C 16/4405 438/763 |
| 2016/0293398 A1* | 10/2016 | Danek | H01L 21/0228 |

* cited by examiner

PROTECTIVE FILM FORMING METHOD

CROSS-REFERENCE TO RELATED APPLICATION

The present application is based on Japanese Priority Application No. 2017-6576 filed on Jan. 18, 2017, the entire contents of which are hereby incorporated herein by reference.

BACKGROUND OF THE INVENTION

1. Field of the Invention

The present invention relates to a protective film forming method.

2. Description of the Related Art

Conventionally, as disclosed in Japanese Laid-Open Patent Application Publication No. 2010-103242, a method for manufacturing a semiconductor device that includes a trench is known. The method includes steps of forming a LOCOS (Local Oxidation of Silicon) in a surface of a silicon layer, forming an impurity region by implanting impurities into the silicon layer, depositing a SiN layer or a $SiO_2$ layer on the silicon layer, selectively forming an opening in the SiN layer or the $SiO_2$ layer by photolithography or etching, and forming a trench in the LOCOS and the silicon layer using the SiN layer or the $SiO_2$ layer with the opening as a mask.

However, due to advancing miniaturization in recent years, it has been becoming difficult to accurately form a contact hole in a desired target. Moreover, it has been also becoming difficult to produce a mask to form the contact hole having the same size as that of the target. To prevent these problems, a protective film that does not allow a portion other than a desired portion to be etched needs to be formed even if an alignment error occurs, but it is very difficult to regionally leave a protective film. To solve these problems, a method for forming a protective film only on a desired location in a self-aligning manner, is demanded.

SUMMARY OF THE INVENTION

The present invention is made in light of the above problems, and provides a protective film forming method that can regionally form a protective film on a desired location in a self-aligning manner.

According to an embodiment, there is provided a protective film forming method is provided. In the method, substantially an entire surface of a silicon-containing underfilm is terminated with fluorine by supplying a fluorine-containing gas to the silicon-containing underfilm formed on a substrate having a surface including a plurality of recesses and a flat surface provided between the adjacent recesses. A surface of the silicon-containing underfilm formed on the flat surface of the substrate is nitrided by supplying a nitriding gas converted to plasma to the silicon-containing underfilm terminated with fluorine such that a silicon adsorption site is formed on the surface of the silicon-containing underfilm formed on the flat surface of the substrate. A silicon-containing gas is adsorbed on the silicon adsorption site by supplying the silicon-containing gas to the silicon-containing underfilm.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments of the Present Invention are described below with reference to accompanying drawings.

First Embodiment (Film Deposition Apparatus)

To begin with, a film deposition apparatus used for a protective film forming method according to a first embodiment of the present disclosure is described below. Although a variety of film deposition apparatuses can perform the protective film forming method according to the embodiments, an example of using a turntable type ALD (Atomic Layer Deposition) apparatus is described below.

Figure 1:
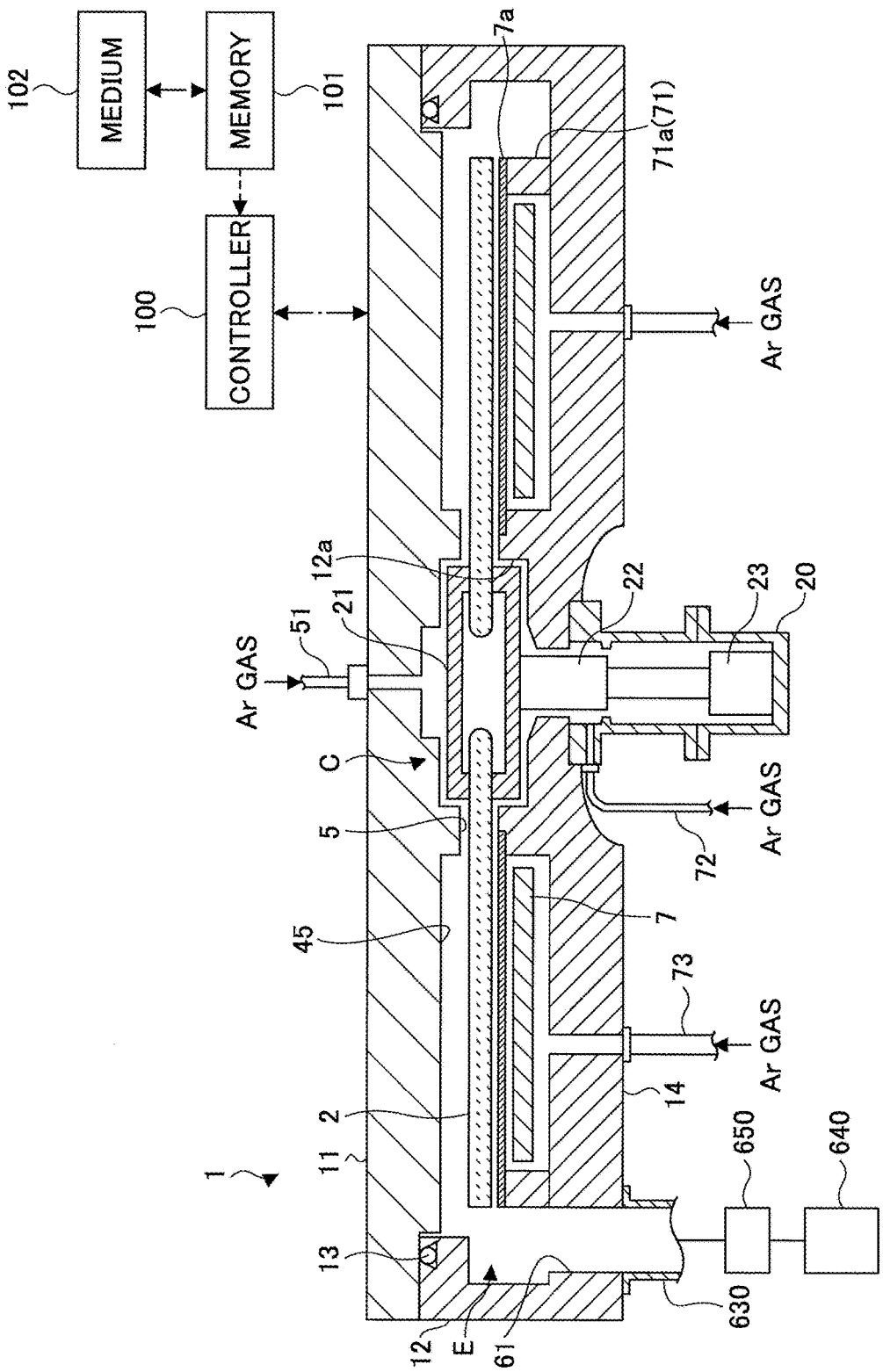
FIG. 1 a schematic cross-sectional view illustrating an example of a film deposition apparatus used for a protective film forming method according to an embodiment of the present disclosure.
Figure 2:
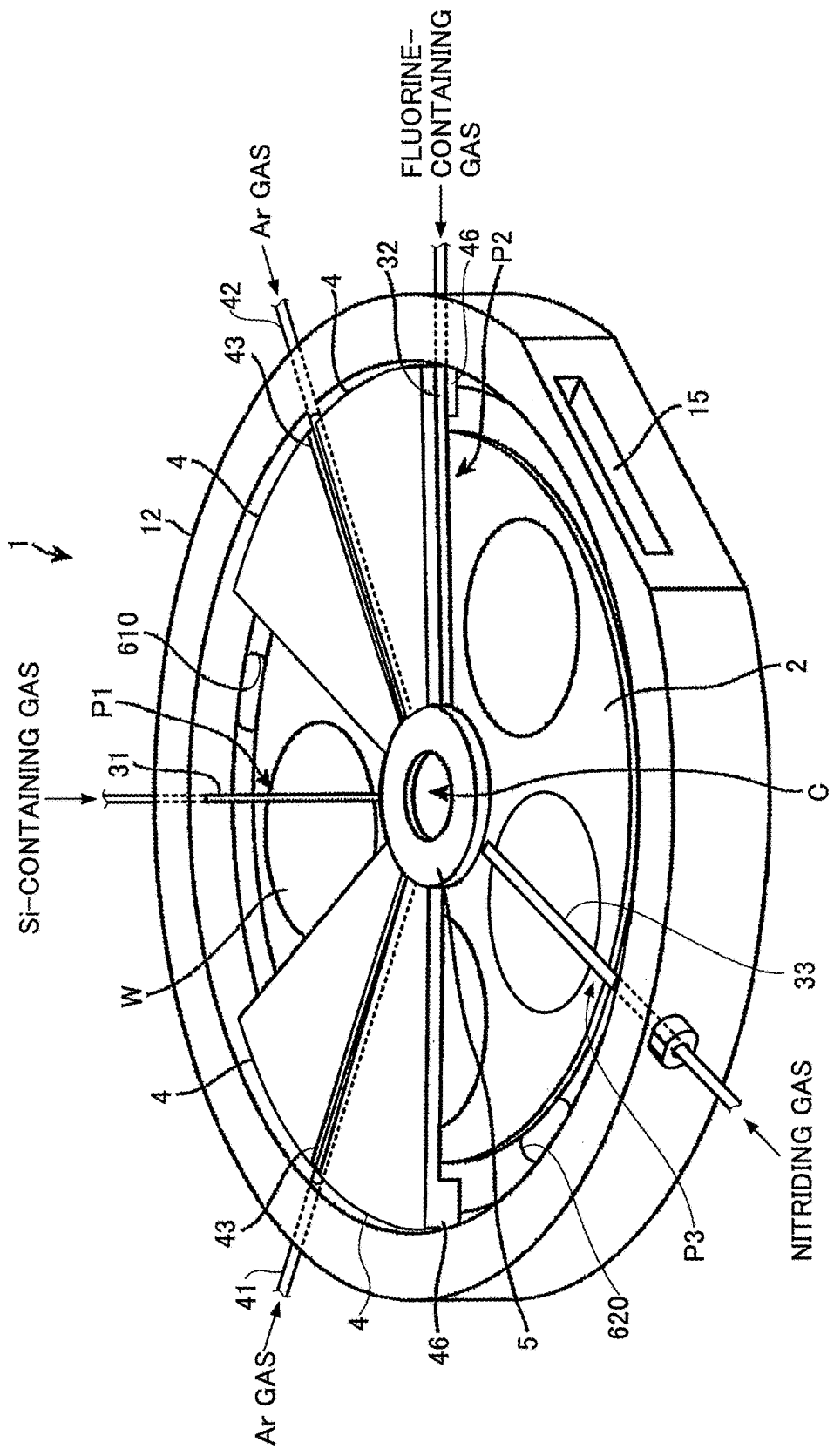
FIG. 2 is a schematic perspective view illustrating an inside structure of a vacuum chamber of the film deposition apparatus illustrated in FIG. 1.
Figure 3:
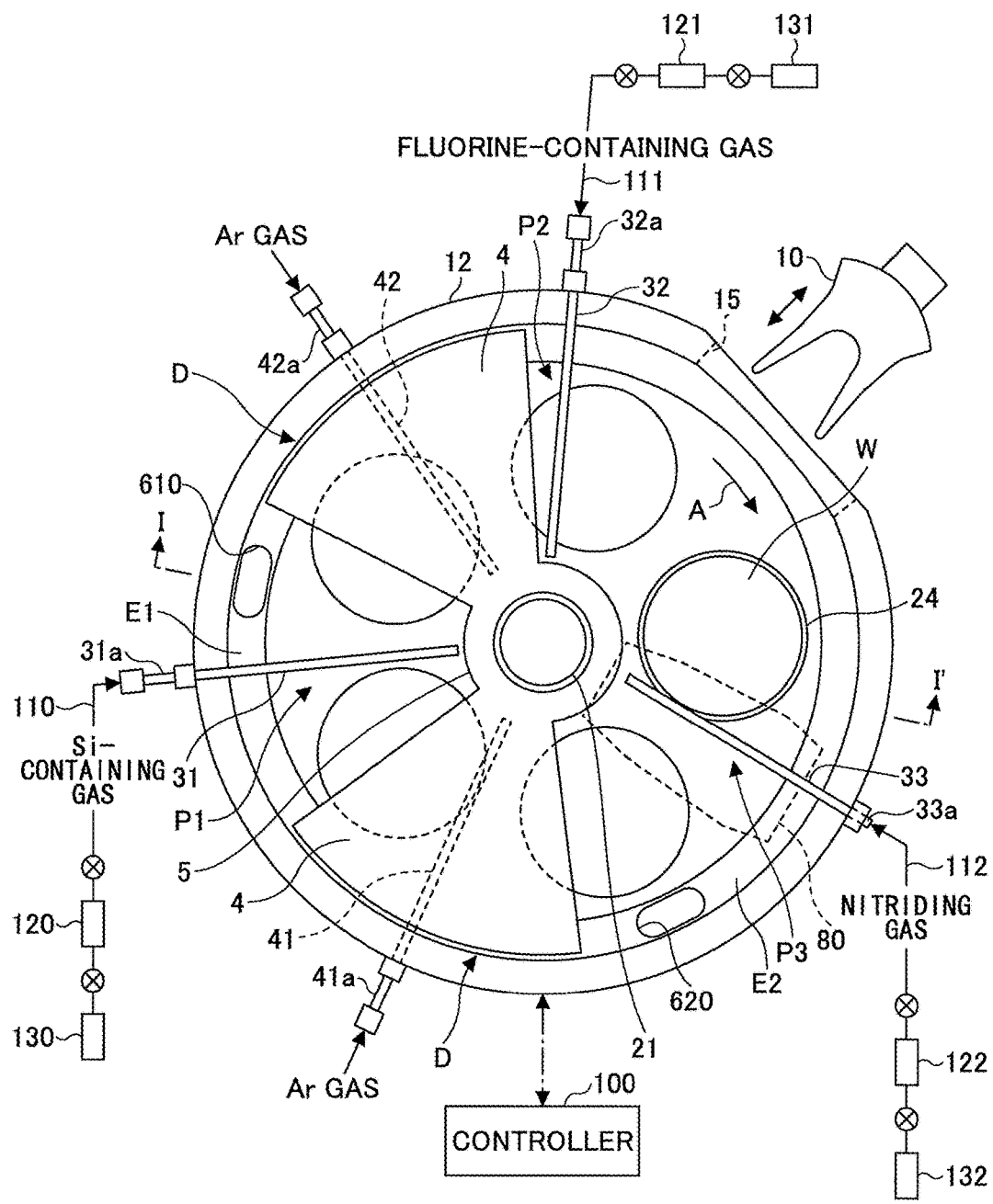
FIG. 3 is a schematic top view illustrating an example of the vacuum chamber of the film deposition apparatus illustrated in FIG. 1.

With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to contain a wafer therein and to perform a film deposition process on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core unit 21 at its center portion. The core unit 21 is fixed to the upper end of a rotary shaft 22 that extends in the vertical direction. The rotary shaft 22 is provided to penetrate the bottom portion 14 of the vacuum chamber 1 and its lower end is attached to a driving unit 23 that rotates the rotary shaft 22 (FIG. 1) about a vertical axis. The rotary shaft 22 and the driving unit 23 are housed in a cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from outside atmosphere.

As illustrated in FIGS. 2 and 3, a plurality of (five in the example of the drawing) circular concave portions 24 is provided at a top surface of the turntable 2 along a rotating direction (circumferential direction) to each receive a plurality of semiconductor wafers (which will be simply referred to as "wafers" hereinafter) W. In FIG. 3, only a single wafer W is illustrated in one of the concave portions 24 for an explanatory purpose. Each of the concave portions 24 is formed to have a slightly larger (for example, 4 mm larger) diameter than that (for example, 300 mm) of the wafer W, and a depth substantially equal to the thickness of the wafer W. Thus, when the wafer W are placed in the respective concave portion 24, the surface of the wafer W and the surface of the turntable 2 (where the wafer W is not placed) become almost the same height. Each of the concave portions 24 has three, for example, through holes in the bottom formed to allow lift pins for supporting a back surface of the wafer W and lifting the wafer W to penetrate through.

FIGS. 2 and 3 are diagrams for explaining an inner structure of the vacuum chamber 1. The ceiling plate 11 is not illustrated in FIGS. 2 and 3 for an explanatory purpose. As illustrated in FIGS. 2 and 3, a reaction gas nozzle 31, a reaction gas nozzle 32, a reaction gas nozzle 33, separation gas nozzles 41 and 42, which are made of quartz, for example, are provided above the turntable 2. In the example illustrated in FIG. 3, the separation gas nozzle 41, the reaction gas nozzle 31, the separation gas nozzle 42, and the reaction gas nozzle 32, and the reaction gas nozzle 33 are arranged in this order from a transfer port 15 (which will be explained later) in a clockwise direction (the rotational direction of the turntable 2 as illustrated by an arrow A in FIG. 3) with a space therebetween in a circumferential direction of the vacuum chamber 1. Gas introduction ports 31a, 32a, 33a, 41a, and 42a (FIG. 3) that are base portions of the nozzles 31, 32, 33, 41, and 42, respectively, are fixed to an outer peripheral wall of the chamber body 12 so that these nozzles 31, 32, 33, 41, and 42 are introduced into the vacuum chamber 1 from the outer peripheral wall of the vacuum chamber 1 so as to extend in a radial direction and parallel to the surface of the turntable 2.

In this embodiment, as illustrated in FIG. 3, the reaction gas nozzle 31 is connected to a silicon-containing gas supply source 130 (not illustrated in the drawings) via a pipe 110, a flow controller 120 and the like (not illustrated in the drawings). A variety of gases can be used as the silicon-containing gas as long as the silicon-containing gas contains silicon, and for example, dichlorosilane ($SiH_2Cl_2$) may be used.

The reaction gas nozzle 32 is connected to a fluorine-containing gas supply source 131 (not illustrated in the drawings) via a pipe 111, a flow controller 121 and the like (not illustrated in the drawings). For example, trifluorochlorine ($ClF_3$), fluorine ($F_2$), nitrogen trifluoride ($NF_3$), tetrafluoromethane ($CF_4$) and the like can be used as the fluorine-containing gas. The fluorine-containing gas is supplied to cause a silicon-containing underfilm deposited on a surface of a wafer W to become fluorine terminated. Because the fluorine-containing gas has high reactivity to be used as an etching gas and the like, any silicon-containing underfilm can be terminated with fluorine regardless of a kind of the silicon-containing film. By causing the entire silicon-containing underfilm to be terminated with fluorine, adsorption inhibition groups to inhibit the adsorption of the silicon-containing gas that is subsequently supplied to the surface can be formed on a surface of the silicon-containing underfilm provided on the surface of the wafer W. For example, when a recessed pattern including a recessed shape such as a via hole or a trench is formed in the surface of the wafer W, by forming the adsorption inhibition groups on substantially the entire surface of the wafer W (exactly the surface of the silicon-containing underfilm) including the recessed pattern, a state in which the silicon-containing gas supplied from the reaction gas nozzle 31 does not adsorb on substantially the entire surface of the wafer W without any change, can be formed.

The reaction gas nozzle 33 is connected to a nitriding gas supply source 132. For example, an ammonia-containing gas is used as the nitriding gas. Although details are described below, as illustrated in FIG. 3 by a dashed line, a plasma generator 80 is mounted on a location where the reaction gas nozzle 33 is provided. Thus, a gas supplied from the reaction gas nozzle 33 is activated by plasma, and a part of the silicon-containing film terminated with fluorine is nitrided. In other words, the activated nitriding gas cannot nitride the inside of the recess shaped pattern such as the trench or via hole, but the activated nitriding gas nitrides only the surface of the wafer W including the flat surface between the recessed shape and a portion at and around a top end of the trench, via hole and the like. Thus, an adsorption site of the silicon-containing gas is formed, and the silicon-containing gas can be adsorbed only on the nitrided portion, which makes it possible to selectively form a cap-shaped protective film on the flat surface between the recessed shapes. Here, because the nitriding gas only has to nitride the silicon-containing gas terminated with fluorine, an $N_2$-containing gas can be also used in addition to the ammonia-containing gas.

The separation gas nozzles 41 and 42 are connected to supply sources (not illustrated in the drawings) of a separation gas via pipes and flow controller valves and the like, respectively. A noble gas such as helium (He) or argon (Ar) or inert gas such as nitrogen ($N_2$) gas can be used as the separation gas. The present embodiment is described by citing an example of using Ar gas as the separation gas.

Each of the reaction gas nozzles 31, 32 and 33 has a plurality of gas discharge holes 35 (see FIG. 4) that faces downward to the turntable 2 along the longitudinal directions of each of the reaction gas nozzles 31, 32 and 33 at intervals of 10 mm, for example. A region below the reaction gas nozzle 31 is a first process region P1 in which the first reaction gas is adsorbed on the wafers W. A region below the reaction gas nozzle 32 is a second process region P2 in which top ends of the silicon-containing underfilm formed on the surface of the carried wafer W are terminated with fluorine. A region below the reaction gas nozzle 33 is a third process region P3 in which the silicon-containing underfilm terminated with fluorine in the second process region P2 is partially nitrided. Here, because the first process region P1 is a region to supply the silicon-containing gas, that is, a source gas, the first process region P1 may be referred to as a silicon-containing gas supply region P1 or a source gas supply region P1. Similarly, because the second process region P2 is a region to supply a fluorine-containing gas, the second process region P2 may be referred to as a fluorine-containing gas supply region P2. Moreover, because the third process region P3 is a region to supply the nitriding gas, the third process region P3 may be referred to as a nitriding gas supply region P3.

The plasma generator 80 is provided above the third process region P3. In FIG. 3, the plasma generator is simply illustrated by a dotted line for an explanatory purpose. A detail of the plasma generator 80 is described below.

Referring to FIGS. 2 and 3, the ceiling plate 11 includes two convex portions 4 protruding in the vacuum chamber 1. As will be explained below, the protruding portions are attached to a lower surface of the ceiling plate 11 so as to protrude toward the turntable 2 to form separation regions D with the corresponding separation gas nozzles 41 and 42. Each of the convex portions 4 has substantially a fan-like planar shape where the apex is removed in an arc shape. For each of the convex portions 4, the inner arc shaped portion is connected to a protruding portion 5 (which will be explained below) and the outer arc shaped portion is formed to extend along an inner peripheral surface of the chamber body 12 of the vacuum chamber 1.

Figure 4:
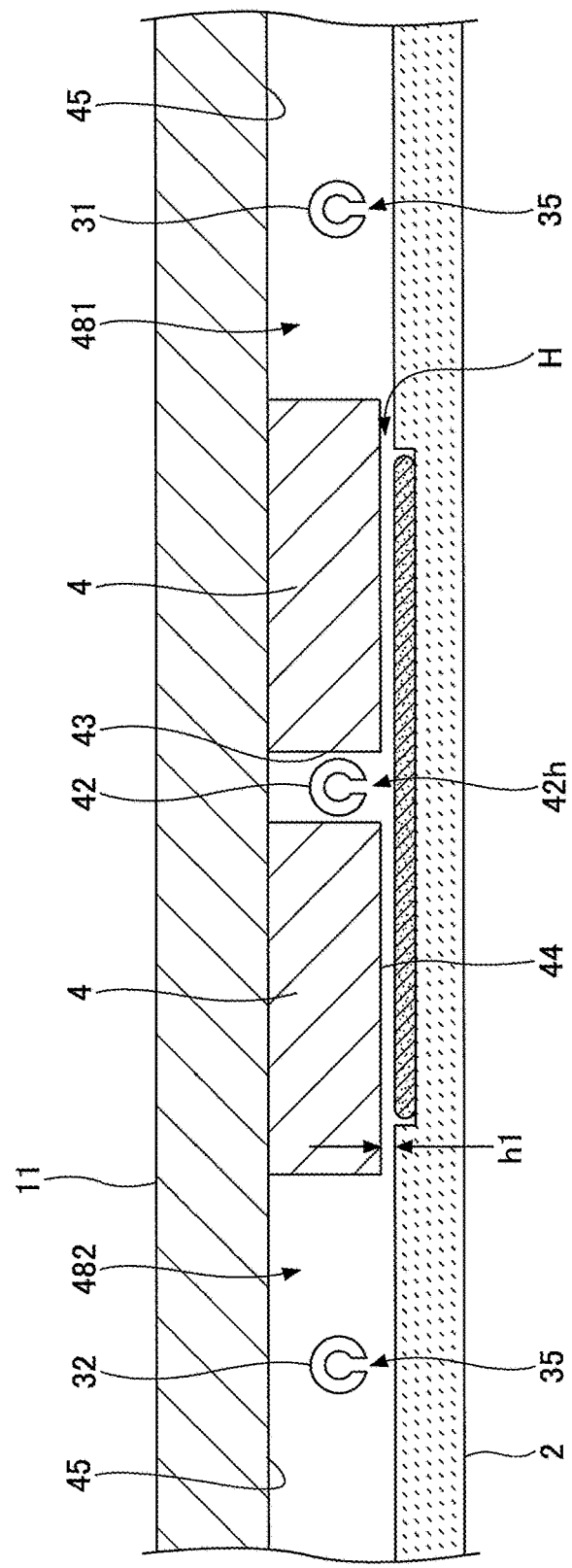
FIG. 4 is a schematic partial cross-sectional view of an example of the film deposition apparatus illustrated in FIG. 1.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, there are provided a flat low ceiling surface 44 (first ceiling surface) formed as the lower surface of the convex portion 4 and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like planar shape where the apex is removed in an arc shape. Furthermore, as illustrated in the drawings, the convex portion 4 includes a groove portion 43 at a center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The reaction gas nozzles 31 and 32 are provided in spaces below the high ceiling surfaces 45, respectively. Each of the reaction gas nozzles 31 and 32 is provided in the vicinity of the wafer W apart from the high ceiling surface 45. Here, the reaction gas nozzle 31 is provided in a space 481 below and on the right side of the high ceiling surface 45, and the reaction gas nozzle 32 is provided in a space 482 below and on the left side of the high ceiling surface 45.

Each of the separation gas nozzles 41 and 42 has a plurality of gas discharge holes 42h (see FIG. 4) formed along the longitudinal direction thereof at a predetermined interval (10 mm, for example).

The low ceiling surface 44 provides a separation space H, which is a narrow space, with respect to the turntable 2. When Ar gas is supplied from the separation gas nozzle 42 to the separation space H, this Ar gas flows toward the space 481 and the space 482 through the separation space H. On this occasion, because the volume of the separation space H is smaller than those of the spaces 481 and 482, the pressure in the separation space H can be made higher than those in the spaces 481 and 482 by Ar gas. It means that the separation space H having the higher pressure is formed between the spaces 481 and 482. Moreover, Ar gas flowing from the separation space H toward the spaces 481 and 482 serves as a counter flow against the first reaction gas from the gas first process region P1 and the second reaction gas from the second process region P2. Thus, the first reaction gas from the first process region P1 is separated from the second reaction gas from the second process region P2 by the separation space H. Therefore, mixing and reacting of the first reaction gas with the second reaction gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas (Ar gas) in order to maintain the pressure in the separation space H higher than those in the spaces 481 and 482.

In the meantime, referring to FIGS. 1 through 3, the ceiling plate 11 further includes the protruding portion 5 at its lower surface to surround the outer periphery of the core unit 21 that supports the turntable 2. The protruding portion 5 is continuously formed with the inner portions of the convex portions 4 and has a lower surface which is formed at the same height as those of the low ceiling surfaces 44, in this embodiment.

Figure 5:
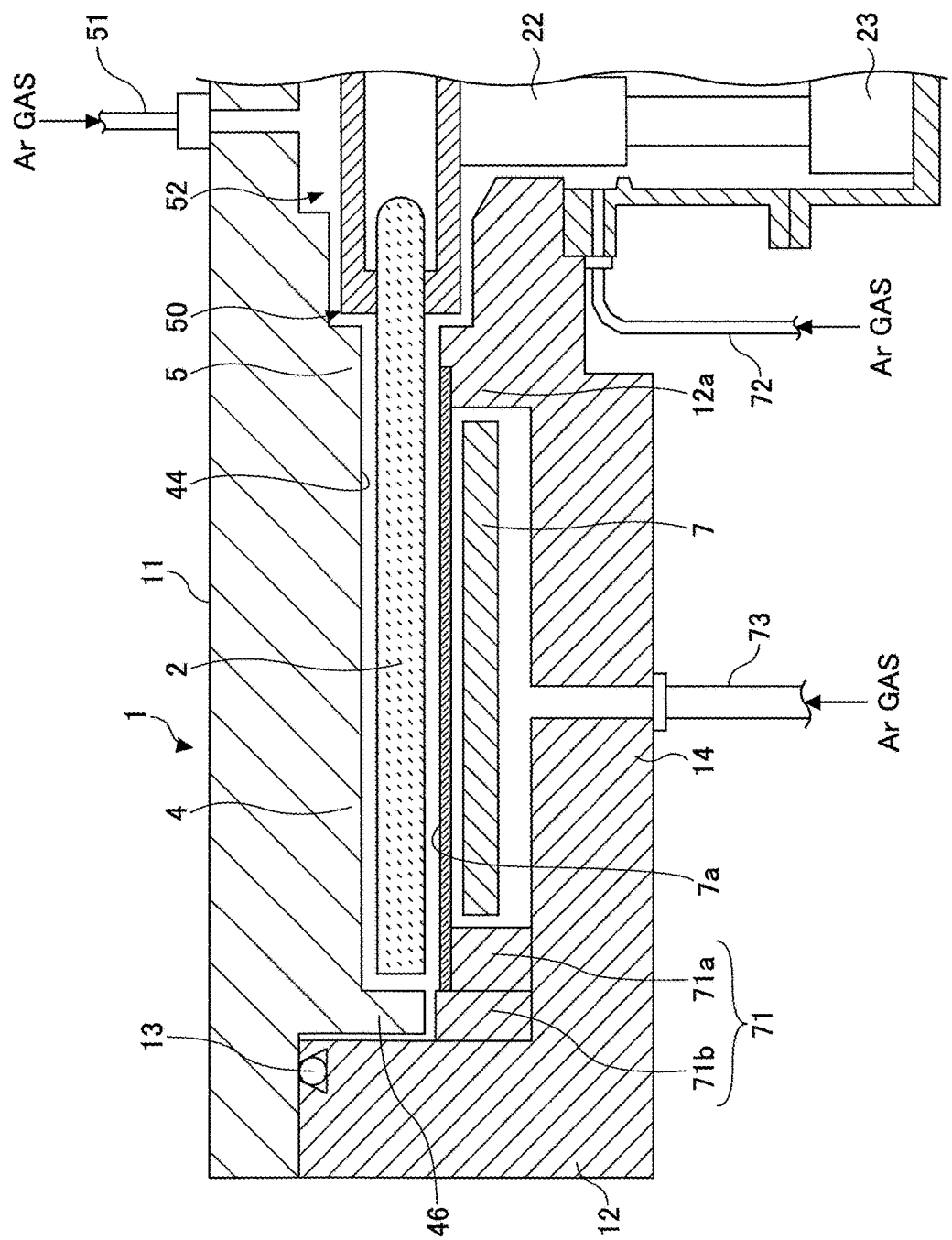
FIG. 5 is another schematic cross-sectional view of the film deposition apparatus illustrated in FIG. 1

FIG. 1 is a cross-sectional view taken along an I-I' line in FIG. 3, and illustrating a region where the ceiling surface 45 is provided. FIG. 5 is a partial cross-sectional view illustrating a region where the ceiling surface 44 is provided. As illustrated in FIG. 5, the convex portion 4 having a substantially fan-like planar shape includes an outer bending portion 46 at its outer peripheral end portion (at an outer peripheral end portion side of the vacuum chamber 1) that is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are provided on the ceiling plate 11 that is detachably attached to the chamber body 12. Thus, there is a slight space between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is provided to extend in a vertical direction to be closer to the outer peripheral surface of the outer bending portion 46 at the separation region D. However, other than the separation region D, as illustrated in FIG. 1, for example, the inner peripheral wall of the chamber body 12 is formed to have a concave portion recessed outward from a location facing the outer end surface of the turntable 2 to the upper end of the bottom portion 14. Hereinafter, for an explanatory purpose, the recessed portion, having a substantially rectangular cross-sectional view, is referred to as an "evacuation region". Specifically, a part of the evacuation region that is in communication with the first process region P1 is referred to as a first evacuation region E1, and a part of the evacuation region which is in communication with the second and third process regions P2 and P3 is referred to as a second evacuation region E2. As illustrated in FIGS. 1 through 3, a first evacuation port 610 and a second evacuation port 620 are respectively provided at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Moreover, a pressure controller 650 is provided between the vacuum pumps 640 and the evacuation pipes 630 in FIG. 1.

As illustrated in FIGS. 2 and 3, a separation region D is not provided between the second process region P2 and the third process region P3, but in the region as the plasma generator 80 in FIG. 3, a case that partitions a space above the turntable 2 is provided. Such a case not only serves as a region on which the plasma generator 80 is mounted but also as a partition member that separates the third process region P3 from the second process region P2.

The heater unit 7 is provided at a space between the turntable 2 and the bottom portion 14 of the vacuum chamber 1 as illustrated in FIGS. 1 and 5. The wafers W placed on the turntable 2 are heated by the heater unit 7 via the turntable 2 to a temperature (450° C., for example) determined by a process recipe. A ring cover member 71 is provided at a lower portion side of the outer periphery of the turntable 2 in order to prevent gasses from flowing into the space below the turntable 2. The cover member 71 includes an inner member 71a provided under the periphery and outside of the turntable 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is provided protrudes upward to be close to the core unit 21 to form a projecting portion 12a. There is provided a narrow space between the projecting portion 12a and the core unit 21. Furthermore, there is provided a narrow space between an inner peripheral surface of the bottom portion 14 and the rotary shaft 22 to be in communication with the case body 20. A purge gas supplying pipe 72 that supplies Ar gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) that are provided at a predetermined angle interval in the circumferential direction below the heater unit 7 for purging the space where the heater unit 7 is provided. Moreover, a cover member 7a is provided between the heater unit 7 and the turntable 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The heater unit 7 heats the wafer W up to a predetermined temperature that does not cause the fluorine-containing gas supplied to the surface of the wafer W to perform etching action, or lower than the predetermined temperature. More specifically, when the wafer W is heated to a high temperature, the fluorine-containing gas exerts its etching action and does not adsorb on a thin film (i.e., the silicon-containing underfilm) but etches the thin film, thereby preventing the film deposition. Hence, after the heating temperature is set to the predetermined temperature that does not cause the etching action, the wafer W is heated.

The film deposition apparatus 1 further includes a separation gas supplying pipe 51 that is connected to a center portion of the ceiling plate 11 of the vacuum chamber 1 and provided to supply Ar gas as the separation gas to a space 52 between the ceiling plate 11 and the core unit 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of the silicon-containing gas supplied to the first process region P1 and the fluorine-containing gas to the second process region P2 by flowing through the center region C can be prevented by the space 50. This means that the space 50 (or the center area C) can function similarly to the separation space H (or the separation region D).

In addition, as illustrated in FIGS. 2 and 3, a transfer port 15 is formed in a side wall of the vacuum chamber 1 for allowing the wafers W, which are substrates, to pass between an external transfer arm 9 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both are not illustrated in the drawings) are provided at a location where the wafer W is transferred and below the turntable 2 because the wafer W is transferred between the external transfer arm 10 and the concave portion 24 of the turntable 2, which is a substrate receiving region, at a location facing the transfer port 15.

Figure 6:
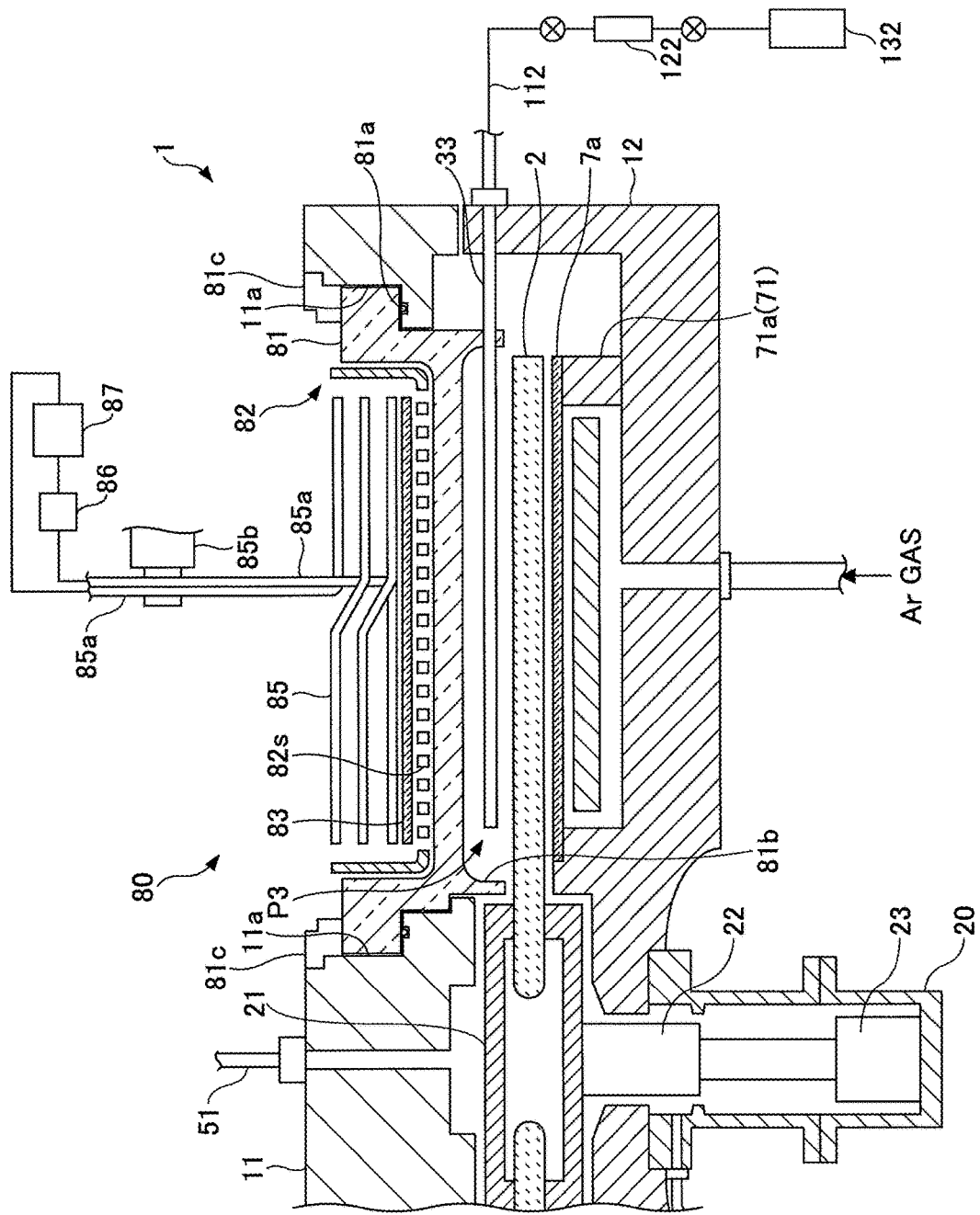
FIG. 6 is a schematic cross-sectional view of an example of a plasma generator provided in the film deposition apparatus illustrated in FIG. 1.
Figure 7:
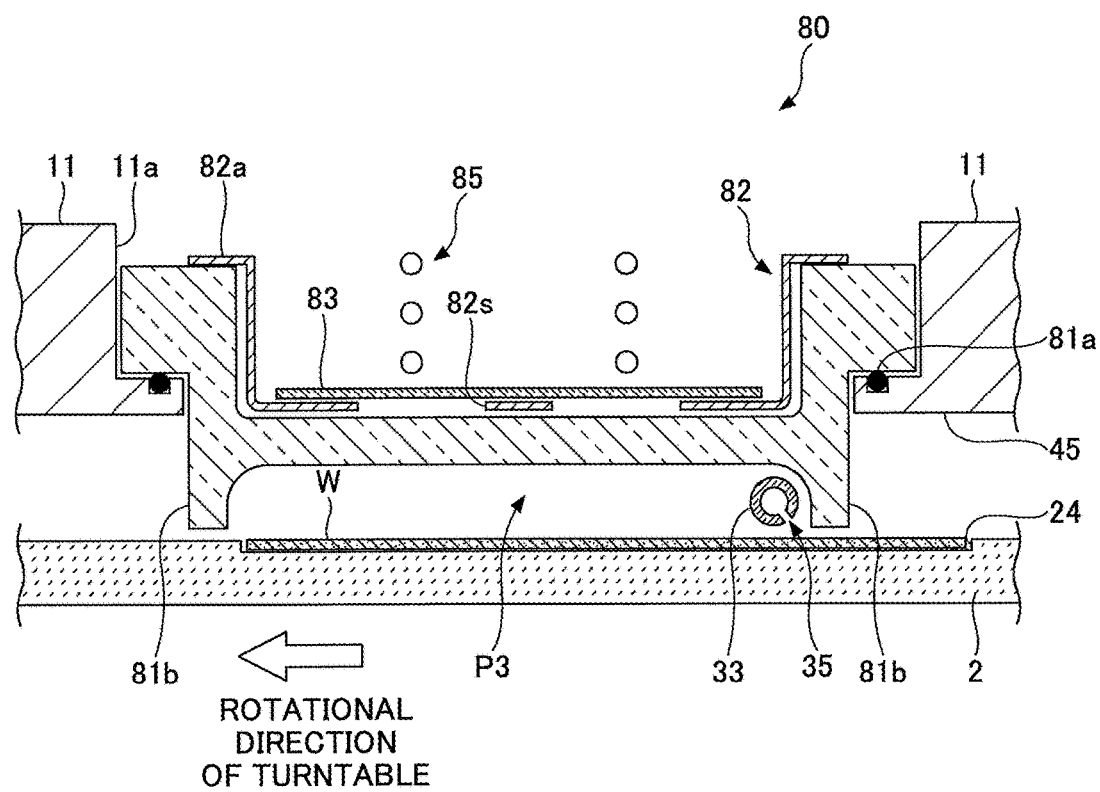
FIG. 7 is another schematic cross-sectional view of the plasma generator illustrated in FIG. 6.
Figure 8:
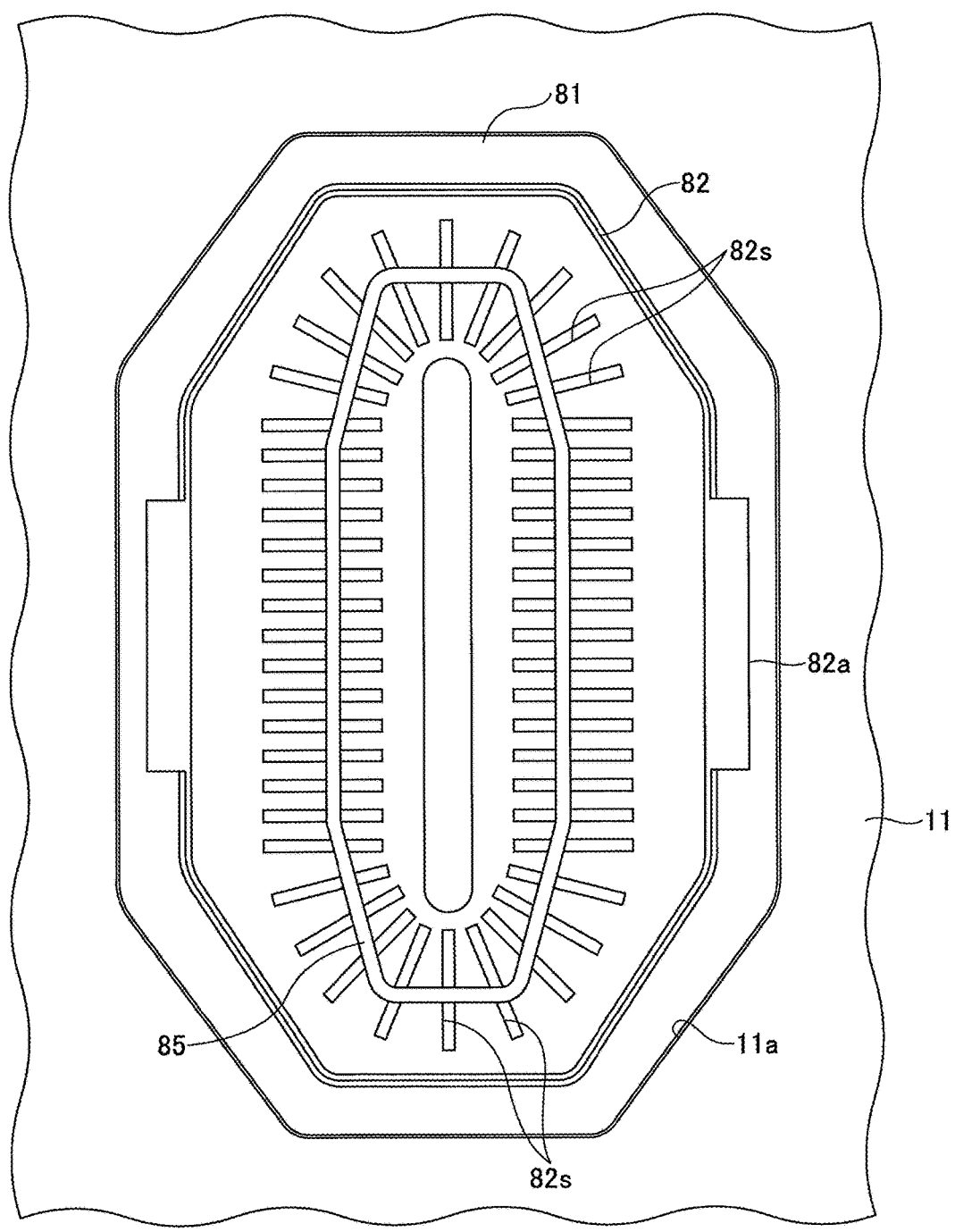
FIG. 8 is a schematic top view of the plasma generator illustrated in FIG. 6.

Next, the plasma generator 80 is described below with reference to FIGS. 6 through 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, some parts of the components are not illustrated or simplified in the drawings.

Referring to FIG. 6, the plasma generator 80 is made of a material that transmits radio frequency waves, and has a recessed portion in its upper surface. The plasma generator 80 further includes a frame member 81 that is embedded in an opening 11a provided in the ceiling plate 11, a Faraday shield plate 82 housed in the concave portion of the frame member 81 and having substantially a box shape whose top is opened, an insulating plate 83 placed on a bottom surface of the Faraday shield plate 82, and a coil antenna 85 supported by the insulating plate 83 thereon. The antenna 85 has substantially an octagonal planar shape.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Moreover, as illustrated in FIG. 6, a pushing member 81c, which extends along the outer peripheral of the frame member 81 that is fitted in the opening 11a of the ceiling plate 11, is provided so that the frame member 81 is pushed downward with respect to the ceiling plate 11. Thus, the ceiling plate 11 and the frame member 81 are further kept in an air-tight manner.

The lower surface of the frame member 81 is positioned to face the turntable 2 in the vacuum chamber 1 and a projection portion 81b that projects downward (toward the turntable 2) is provided at the perimeter at the lower surface. The lower surface of the projection portion 81b is close to the surface of the turntable 2 and a space (hereinafter referred to as the third process region P3) is surrounded by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 and the upper surface of the turntable 2 in the separation space H (FIG. 4).

In addition, the reaction gas nozzle 33 that penetrates through the projection portion 81b is provided in the third process region P3. In this embodiment, as illustrated in FIG. 6, the nitriding gas supply source 132 filled with a nitriding gas such as $NH_3$ is connected to the reaction gas nozzle 33 by the pipe 112 through the flow controller 122. The nitriding gas whose flow rate is controlled by the flow controller 122 is supplied to the third process region P3 at a predetermined flow rate. The supplied nitriding gas is converted to plasma (or is activated) by the plasma generator 80, and is supplied to the surface of the wafer W.

The reaction gas nozzle 33 has a plurality of gas discharge holes 35 formed along the longitudinal direction thereof at a predetermined interval (10 mm, for example), and the above-mentioned nitriding gas and the like are discharged from the gas discharge holes 35. As illustrated in FIG. 7, the gas discharge holes 35 are provided to be inclined from a vertical direction with respect to the turntable 2 toward the upstream rotation direction of the turntable 2. Due to this, the gas supplied from the reaction gas nozzle 33 is discharged in a direction opposite to the rotational direction of the turntable 2, specifically, toward a space between a lower surface of the projection portion 81b and the surface of the turntable 2. Thus, the flows of the reaction gas and the separation gas from a space below the ceiling surface 45 that is upstream of the plasma generator 80 toward the third process region P3 along the rotation direction of the turntable 2 can be prevented. Furthermore, as described above, because the projection portion 81b that is formed along an outer periphery of the lower surface of the frame member 81 is close to the surface of the turntable 2, the pressure in the third process region P3 can be kept high by the gas from the reaction gas nozzle 33. This also prevents the reaction gas and the separation gas from flowing into the third process region P3.

Thus, the frame member 81 plays a role not only in supporting the mounted plasma generator 80 but also in separating the third process region P3 from the second process region P2.

The Faraday shield plate 82 is made of a conductive material such as a metal and is grounded, although not illustrated in the drawings. As clearly illustrated in FIG. 8, the Faraday shield plate 82 has a plurality of slits 82s in its bottom portion. Each of the slits 82s extends substantially perpendicularly to a corresponding side of the antenna 85 that has the substantially octagonal planar shape.

As illustrated in FIGS. 7 and 8, the Faraday shield plate 82 includes two support portions 82a that are provided at upper end portions that bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency waves radiated from the antenna 85 downward.

The antenna 85 is formed by winding a pipe made of copper three times, for example, in a substantially octagonal planar shape. Thus, cooling water can be circulated in the pipe, and the antenna 85 is prevented from being heated to be a high temperature by the radio frequency power supplied to the antenna 85. As illustrated in FIG. 6, the antenna 85 includes a standing portion 85a to which a support portion 85b is attached. The antenna 85 is maintained at a predetermined position in the Faraday shield plate 82 by the support portion 85b. The radio frequency power source 87 is connected to the support portion 85b via a matching box 86. The radio frequency power source 87 is capable of generating radio frequency power having a frequency of 13.56 MHz, for example.

According to the plasma generator 80 thus structured, when the radio frequency power is supplied to the antenna 85 from the radio frequency power source 87 via the matching box 86, an electromagnetic field is generated by the antenna 85. In the electromagnetic field, the electric field component is shielded by the Faraday shield plate 82 so as not to be transmitted downward. On the other hand, the magnetic field component is transmitted into the third process region P3 through the plurality of slits 82s of the Faraday shield plate 82. The nitriding gas supplied to the third process region P3 from the reaction gas nozzle 33 at a predetermined flow ratio is activated by the magnetic field component.

As illustrated in FIG. 1, the film deposition apparatus according to the present embodiment further includes a controller 100 that controls the entirety of the film deposition apparatus. The control unit 100 may be a computer. A memory in the controller 100 stores a program to cause the film deposition apparatus to execute the film deposition method (as will be described below) under control of the controller 100. The program is formed to include steps capable of executing the film deposition method. The program is stored in a medium such as a hard disk, a compact disk (CD), a magneto-optic disk, a memory card, and a flexible disk, read into a memory unit 101 by a predetermined reading device, and is installed in the controller 100.

The controller 100 may also control a setting temperature of the heater unit 7, and the flow controllers 121 and 122 that adjust the flow rates of the fluorine-containing gas and the nitriding gas supplied to the reaction gas nozzles 32 and 33, respectively. By doing this, while the temperature of the heater unit 7 can be set at a predetermined temperature that does not cause the etching effect of the fluorine-containing gas, the fluorine-containing gas can be supplied at a flow rate where the fluorine-containing gas does not reach the bottom surface of the recessed pattern of the wafer W and stay and adsorb on the upper portion of the recessed pattern.

[Protective Film Forming Method]

Figure 9A:
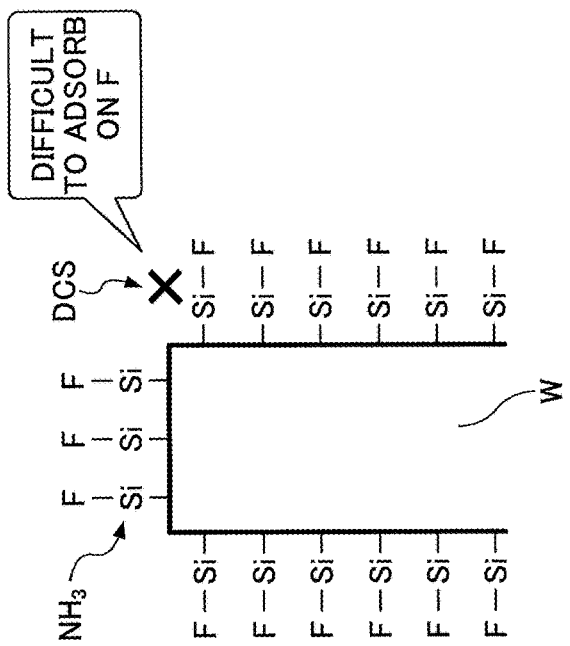
FIGS. 9A through 9E are diagrams illustrating a series of processes of a protective film forming method according to an embodiment of the present disclosure.

Next, a protective film forming method according to a first embodiment of the present disclosure is described below by citing an example of using the above-mentioned film deposition apparatus, with reference to FIGS. 9A through 9E. FIGS. 9A through 9E are diagrams illustrating an example of a series of processes of the protective film forming method according to the first embodiment of the present disclosure. FIG. 9A is a diagram illustrating a state of a wafer W when starting the protective film forming method according to the first embodiment of the present disclosure.

In this embodiment, a silicon wafer is used as the wafer W and the silicon wafer has a trench T (recessed shape) as illustrated in FIG. 9A. FIG. 9A illustrates only enlarged inner wall surfaces of two adjacent trenches and a flat surface between the two adjacent trenches. A small amount of thin film of SiN is formed on surfaces in the trenches and a surface of the wafer W (flat surface). The SiN film is an example of a silicon-containing underfilm, and another silicon-containing film may be used.

In the first embodiment, an example is described below of supplying a mixed gas of $ClF_3$ and Ar (which are expressed as "$ClF_3$/Ar" hereinafter) as a fluorine-containing gas, supplying $SiH_2Cl_2$ as a silicon-containing gas, and supplying a mixed gas of $NH_3$ and Ar (which are expressed as "$NH_3$/Ar" hereinafter) as a nitriding gas.

To begin with, a gate valve (not illustrated in the drawings) is opened and the wafer W is transferred to the concave portion 24 of the turntable 2 via the transfer port 15 (FIGS. 2 and 3) by the transfer arm 10 (FIG. 3) from the outside. This transfer is performed by lifting the lift pins (not illustrated in the drawings) via through holes provided in the bottom surface of the concave portion 24 from the bottom portion side of the vacuum chamber 1 when the concave portion 24 stops at a position facing the transfer port 15. By repeating such a wafer transfer while intermittently rotating the turntable 2, the wafers W are each loaded into the concave portions 24.

Then, the gate valve is closed, and the vacuum chamber 1 is evacuated by the vacuum pump 640 to the attainable degree of vacuum. Then, Ar gas as a separation gas is discharged from the separation gas nozzles 41 and 42 at a predetermined flow rate. At this time, Ar gas is also discharged from the separation gas supplying pipe 51 and the purge gas supplying pipes 72 and 73 at a predetermined flow rate, respectively. With this, the vacuum chamber 1 is adjusted to a preset processing pressure by the pressure controller 650 (FIG. 1). Then, the wafers W are heated to 400 degrees C., for example, by the heater unit 7 while rotating the turntable 2 in a clockwise direction at a rotational speed of 180 rpm, for example. The rotational speed of the turntable 2 can be set at a variety of rotational speeds depending on the intended purpose. Because the fluorine-containing gas can relatively readily cause a silicon-containing underfilm to be terminated with fluorine, there is no problem of rotating the turntable 2 at relatively high speed. Hence, for example, the rotational speed of the turntable 2 may be set at a high speed in a range from about 50 to about 250 rpm. The wafer temperature may be set at a variety of temperatures depending on the intended use. For example, the wafer temperature may be set at an appropriate temperature in a range from 300 to 600° C.

Subsequently, $ClF_3$/Ar gas is supplied from the reaction gas nozzle 32. No gas is supplied from the reaction gas nozzles 31 and 33, or Ar gas is supplied from the reaction gas nozzles 31 and 33 as a purge gas.

By the rotation of the turntable 2, the wafer W repeatedly passes through the third process region P3, the separation region D, the first process region P1, the separation region D, and the second process region P2 in this order (see FIG. 3). When the wafer W passes through the second process region P2, $ClF_3$/Ar is supplied to the wafer W, and the top ends of SiN that is the silicon-containing underfilm are terminated with fluorine. In the other regions, only a fluorine terminated reaction occurs because only Ar gas of the purge gas is supplied to the wafer W, or no gas is supplied to the wafer W. On this occasion, although each of the wafers W starts the process from different locations of the process regions P1 through P3 or separation regions D depending on the first placed location when the turntable 2 starts rotating, the case where each of the wafers W starts from the third process region P3 is described below for the purpose of illustration.

Figure 9B:
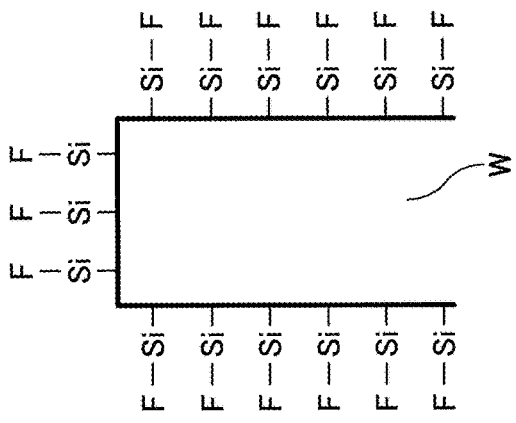

FIG. 9B is a diagram illustrating an example of a fluorine terminated process (or fluorine-containing gas supply process). As illustrated in FIG. 9B, when the wafer W passes through the second process region P2, $ClF_3$/Ar is supplied to the silicon-containing underfilm inside and outside the trenches, and the top ends of the SiN film that is the silicon-containing underfilm are terminated with fluorine, thereby changing approximately the entire surface of SiN into SiF. Here, in the fluorine-containing gas supply process, it is sufficient to rotate the turntable 2 at least one time, preferably two or three times to perform the process while the reaction gas nozzle 32 supplies $ClF_3$/Ar to the wafer W. As discussed above, because the fluorine-containing gas is a gas that is used as an etching gas and has intense reactivity, it is sufficient to rotate the turntable 2 a couple of times to several times to form SiF, and for example, it is sufficient to rotate the turntable 2 one to five times. In other words, the fluorine-containing gas such as $ClF_3$/Ar is supplied to the silicon-containing underfilm within a scope that does not etch the silicon-containing underfilm but cause the silicon-containing underfilm to be terminated with fluorine. Hence, the upper limit of the number of times of rotating the turntable 2 while supplying the fluorine-containing gas to the wafer W is set to the number of times at which the silicon-containing underfilm is not etched but is terminated with fluorine, and may be set at any number between one and five, for example. Thus, the fluorine-containing gas is supplied to the silicon-containing underfilm without etching the silicon-containing underfilm.

After finishing the fluorine terminated process illustrated in FIG. 9B, the pressure in the vacuum chamber 1, the rotational speed of the turntable 2 and the like are changed to appropriate conditions for depositing the SiN film. The change of the conditions may be performed while stopping the rotation of the turntable 2 and the supply of the reaction gases from the reaction gas nozzles 31 through 33, or may be performed while continuously rotating the turntable 2 if the rotational speed of the turntable 2 is not changed.

Figure 9C:
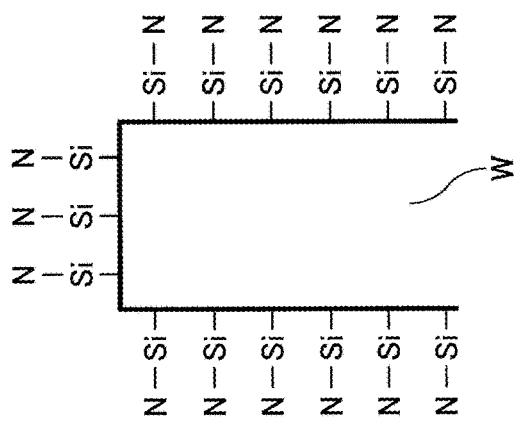

FIG. 9C is a diagram illustrating an example of a first half of a nitriding process. In the nitriding process, a nitriding gas is supplied from the reaction gas nozzle 33 and is supplied to the wafer W while the nitriding gas is converted to plasma by the plasma generator 80. On this occasion, because the fluorine-containing gas is a type of gas unlikely to be replaced by any gas, the nitriding effect reaches only to a location at and around the surface of the wafer W, only the surface of the wafer W (flat surface) between the recessed shapes (e.g., trenches) and the top end of the recessed shapes are nitrided.

Here, in the nitriding process, other than supplying Ar gas from the separation gas nozzles 41 and 42, only the reaction gas nozzle 33 may supply $NH_3/Ar$, or the reaction gas nozzle 33 may supply $NH_3/Ar$ and the reaction gas nozzle 31 may supply $SiH_2Cl_2$ at the same time. Even if the reaction gas nozzle 31 supplies $SiH_2Cl_2$ that is the silicon-containing gas, because the fluorine terminated SiN film does not have the adsorption site for the silicon-containing gas, $SiH_2Cl_2$ does not adsorb on the surface of the SiF film until the nitrided portion is generated.

Figure 9E:
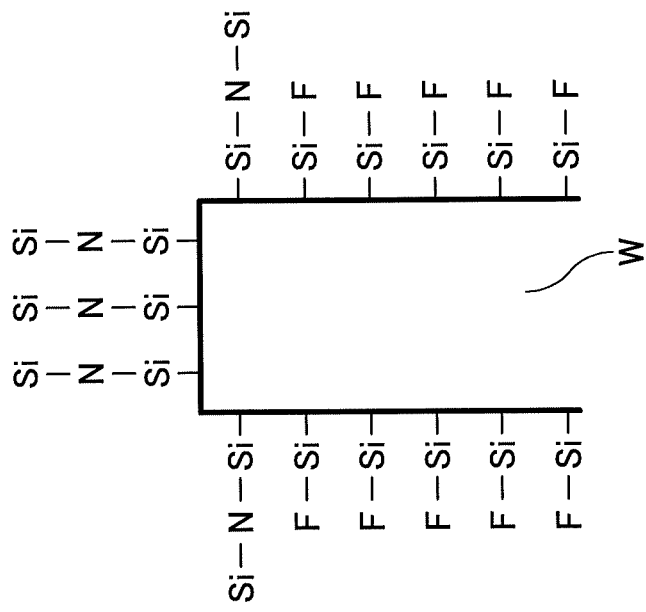
Figure 9D:
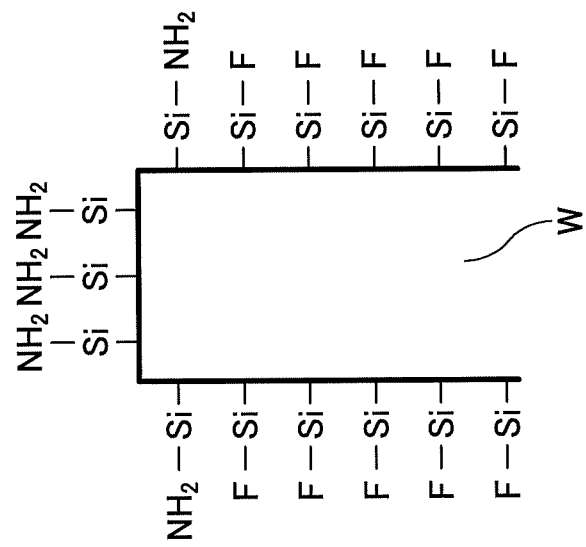

FIG. 9D is a diagram illustrating an example of a last half of the nitriding process. As illustrated in FIG. 9D, by supplying $NH_3/Ar$ converted to plasma to the wafer W, only F groups on the flat surface of the wafer W between the recessed shapes and on the side surfaces in a portion at and around the top ends of the recessed shapes are replaced by $NH_2$ groups, and are nitrided. Here, with respect to the nitriding range, it is enough to nitride only the flat surface between the recessed shapes, and the purpose of forming the protective film can be sufficiently achieved as long as the above-mentioned range (only the flat surface) is nitrided. However, in general, not only the flat surface but also the side surfaces near the top ends of the recessed shapes are often nitrided. By forming such $NH_2$ groups, the adsorption site of the silicon-containing film is formed.

Next, if the reaction gas nozzle 31 does not supply any gas or supplies Ar gas that is the purge gas, then the reaction gas nozzle 31 switches and supplies $SiH_2Cl_2$ that is the silicon-containing gas to the wafer W. On the other hand, $SiH_2Cl_2$ is already supplied to the wafer W simultaneously with the nitriding gas, the rotation of the turntable 2 is just continued, and the wafer W passes through the first process region P1.

FIG. 9E is a diagram illustrating an example of a silicon adsorption process. When the wafer W having an adsorption site on the surface of the silicon-containing film passes through the first process region P1, $SiH_2Cl_2$ that is the silicon-containing gas adsorbs on $NH_2$ groups that are the adsorption sites, and a SiN film is formed. On this occasion, because the SiN film adsorbs only on the adsorption sites, the SiN film is formed on the flat surface between the recessed shapes and on the side surfaces at and near the top ends of the recessed shapes, and a protective film that covers only the top end portion between the recessed shapes such as trenches is formed.

After that, by rotating the turntable 2 repeatedly while supplying $SiH_2Cl_2$ of the silicon-containing gas and $NH_3/Ar$ of the nitriding gas, the cycle illustrated in FIGS. 9D and 9E are repeated, and the SiN film is deposited only on the top end portion of the trenches as the protective film.

Thus, according to the film deposition method of the embodiment of the present disclosure, by supplying a fluorine-containing gas to a silicon-containing film at first to form adsorption inhibition groups on the entire surface, nitriding only the flat surface and its surroundings of the wafer W to form an adsorption site, and depositing a film by ALD (Atomic Layer Deposition), a film is selectively deposited on the flat surface between the recessed shapes such as trenches, and a protective film can be formed.

In the present embodiment, an example of using $ClF_3/Ar$ gas as the fluorine-containing gas, using $NH_3/Ar$ gas as the nitriding gas, and using $SiH_2Cl_2$ gas as the Si-containing gas is described, but as discussed above, another type of gas can be used for each gas.

While repeating the steps of FIGS. 9D and 9E, the adsorption inhibition effect of fluorine can be reduced. In this case, after repeating the steps of FIGS. 9D and 9E predetermined number of times until forming the protective film up to a predetermined thickness, the steps of FIGS. 9B and 9C may be performed one more time as necessary. In other words, one-time fluorine terminated process and predetermined number of times of the nitriding process and the silicon adsorption process are made one cycle, and this cycle may be repeated predetermined number of times until depositing the protective film up to a desired film thickness. Thus, a high-quality protective film having a desired film thickness can be formed.

Furthermore, the film deposition apparatus used in the protective film forming method according to the present embodiment can deposit the silicon-containing underfilm at first. In this case, a film deposition step to form the Si-containing underfilm illustrated in FIG. 9A may be performed at first. The method is the same as the description of FIGS. 9D and 9E, and the silicon-containing underfilm can be formed by repeating the steps of FIGS. 9D and 9E.

Second Embodiment (Film Deposition Apparatus)

Figure 10:
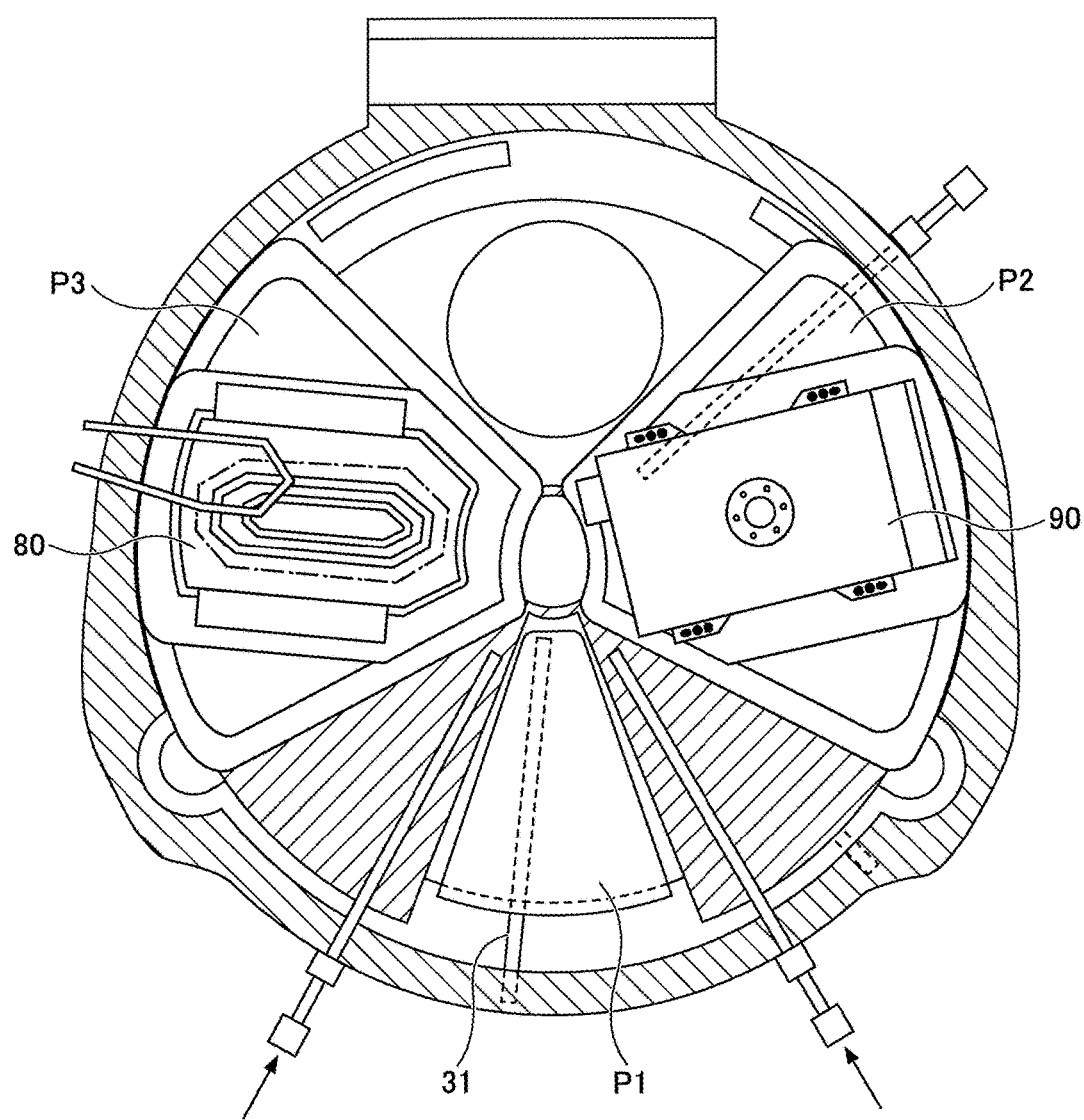
FIG. 10 is a schematic cross-sectional view of an example of a film deposition apparatus used for a protective film forming method according to an embodiment of the present disclosure.

FIG. 10 is a diagram illustrating an example of a film deposition apparatus preferably used for a film deposition forming method according to a second embodiment of the present disclosure.

The film deposition apparatus illustrated in FIG. 10 differs from the film deposition apparatus used for the protective film forming method according to the first embodiment illustrated in FIGS. 1 through 8 in that a remote plasma generator 90 is provided at the second process region P2. Moreover, in FIGS. 2 and 3, although the first process region P1, the second process region P2 and the third process region P3 are arranged in a clockwise fashion in this order, in FIG. 10, the film deposition apparatus differs from the film deposition apparatus used for the protective film forming method according to the first embodiment in that the first process region P1, the third process region P3 and the second process region P2 are arranged in a clockwise fashion in this order. Because the other components are the same as those of the film deposition apparatus illustrated in FIGS. 1 through 8, the description is omitted.

By providing the remote plasma generator 90 at the second process region P2, a fluorine-containing gas can be supplied by being converted to plasma. Thus, the fluorine terminated process can be performed by supplying the fluorine-containing gas converted to the plasma to a wafer W.

In addition, when the fluorine-containing gas is supplied in the second process region P2, no gas or only a purge gas is supplied to the wafer W in the third process region P3, and when nitriding plasma is supplied to the wafer W in the third process region P3, the fluorine-containing gas is not supplied to the wafer W in the second process region P2. Hence, the gas supply in the second process region P2 and the gas supply in the third process region P3 do not interfere with each other. Accordingly, even when the second process region P2 and the third process region P3 are arranged in an opposite manner, the order of supplying the gas to the wafer W does not change in the sequence illustrated in FIGS. 9A through 9E. Hence, although the third process region P3 and the second process region P2 are arranged differently from those in FIGS. 2 and 3 in FIG. 10, there is no problem in this point.

Figure 11:
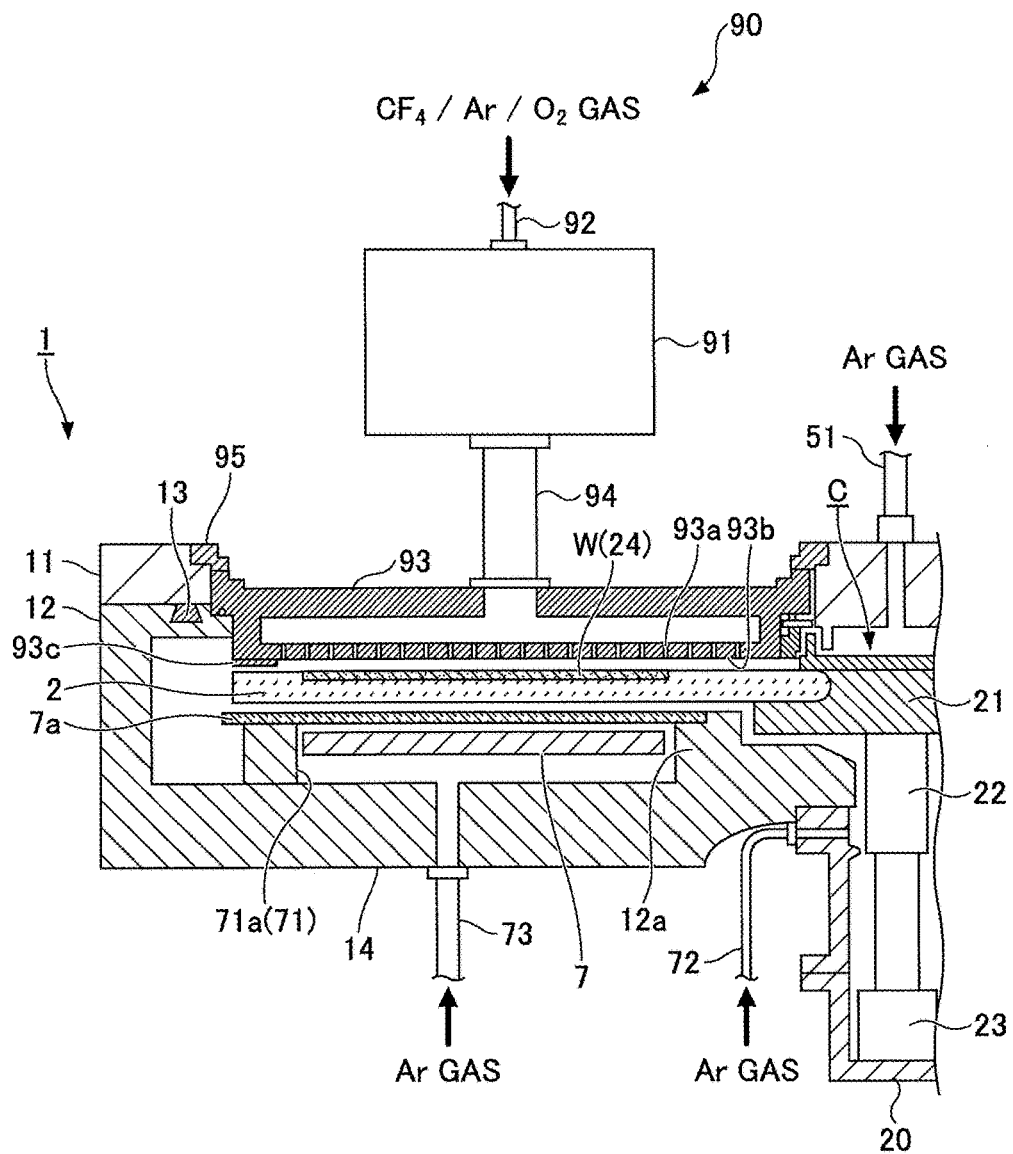
FIG. 11 is a partial cross-sectional view for illustrating a second process region P2 of a film deposition apparatus in FIG. 10.

Next, the remote plasma generator 90 is described with reference to FIGS. 10, 11 and 12. FIG. 11 is a partial cross-sectional view for describing the second process region P2 in FIG. 10.

The remote plasma generator 90 is provided opposite to the turntable 2 at the second process region P2. The remote plasma generator 90 supplies an activated fluorine-containing gas to a film deposited on the wafer W. As illustrated in FIG. 11, the remote plasma generator 90 includes a plasma generation part 91, an etching gas supply pipe 92, a showerhead part 93, and a pipe 94. Note that the showerhead part 93 is an example of a fluorine-containing gas discharging part. Hence, for example, a fluorine-containing gas nozzle may be used instead of the showerhead part 93.

The plasma generation part 91 activates a fluorine-containing gas supplied from the fluorine-containing gas supply pipe 92 using a plasma source. The plasma source is not particularly limited as long as it is capable of activating the fluorine-containing gas to generate F (fluorine) radicals. For example, an inductively coupled plasma (ICP), a capacitively coupled plasma (CCP), or a surface wave plasma (SWP) may be used as the plasma source.

The fluorine-containing gas supply pipe 92 has one end that is connected to the plasma generation part 91 to supply the fluorine-containing gas to the plasma generation unit 91. The other end of the fluorine-containing gas supply pipe 92 may be connected to a fluorine-containing gas supply source that stores the fluorine-containing gas via an on-off valve and a flow controller, for example. Note that a variety of fluorine-containing gases are available for the fluorine-containing gas as long as the fluorine-containing gas can cause the silicon-containing underfilm deposited on the wafer W to be partially terminated with fluorine. Specifically, for example, in addition to $ClF_3$ discussed above, fluorine-containing gases including hydrofluorocarbons such as $CHF_3$ (trifluoromethane), fluorocarbons such as $CF_4$ (carbon tetrafluoride) may be used. Furthermore, gases such as Ar gas and/or $O_2$ gas may be added to these fluorine-containing gases at appropriate amounts, for example.

The showerhead part 93 is connected to the plasma generation unit 91 via the pipe 94. The showerhead part 93 supplies the fluorine-containing gas that has been activated by the plasma generation part 91 into the vacuum chamber 1. The showerhead part 93 is fan-shaped in planar view and is pressed downward along the circumferential direction by a press member 95 that is formed along the outer edge of the fan shape. The press member 95 is fixed to the ceiling plate 11 by a bolt or the like (not illustrated), and in this way, the internal atmosphere of the vacuum chamber 1 may be maintained airtight. The distance between a bottom surface of the showerhead part 93 when it is secured to the ceiling plate 11 and a surface of the turntable 2 may be arranged to be about 0.5 mm to about 5 mm, for example. A region below the showerhead part 93 corresponds to the second process region P2. In this way, F radicals contained in the activated fluorine-containing gas that is supplied into the vacuum chamber 1 via the showerhead part 93 efficiently react with the silicon-containing underfilm deposited on the wafer W.

A plurality of gas discharge holes 93a are arranged at the showerhead part 93. In view of the difference in angular velocity of the turntable 2, fewer gas discharge holes 93a are arranged at a rotational center side of the showerhead part 93, and more gas discharge holes 93a are arranged at an outer peripheral side of the showerhead part 93. The total number of the gas discharge holes 93a may be several tens to several hundreds, for example. Also, the diameter of the plurality of gas discharge holes 93a may be about 0.5 mm to 3 mm, for example. The activated fluorine-containing gas supplied to the showerhead part 93 may be supplied to the space between the turntable 2 and the showerhead part 93 via the gas discharge holes 93a.

Figure 12:
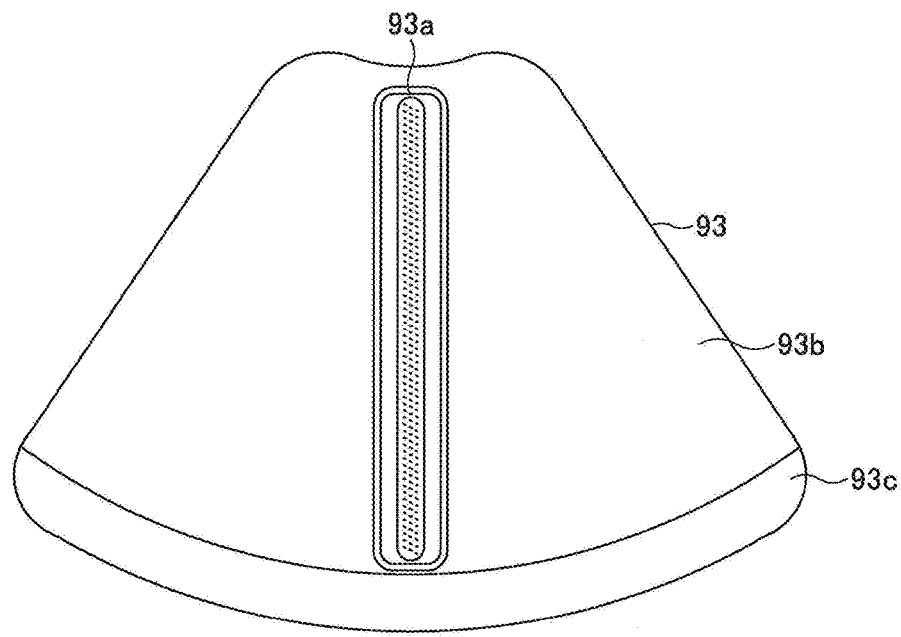
FIG. 12 is a plan view illustrating an example of a lower surface of a showerhead part.

FIG. 12 is a planar view illustrating an example of a lower surface of the showerhead part 93. As illustrated in FIG. 12, a downward protruding surface 93c may be provided in a belt-like form along the outer circumference of the lower surface 93b of the fan-shaped showerhead part 93. This can uniformly prevent the pressure on the outer peripheral side of the fluorine terminated region P2 from decreasing in the circumferential direction. Moreover, the gas discharge holes 93a may be provided at the center of the lower surface 93b of the showerhead part 93 in the circumferential direction so as to extend in the radial direction. Thus, the fluorine-containing gas can be supplied in a dispersed manner from the central side throughout the outer peripheral side of the turntable 2.

Thus, the film deposition apparatus may be configured to use the remote plasma generator 90 that supplies the activated fluorine-containing gas to the silicon-containing underfilm, thereby reliably perform the fluorine terminated process.

(Protective Film Forming Method)

The protective film forming method according to the second embodiment of the present disclosure can be performed in a similar sequence to the protective film forming method according to the first embodiment. The different point is only supplying an activated fluorine-containing gas to the silicon-containing underfilm in the fluorine terminated process in FIG. 9B, and the process in itself does not change. By performing the fluorine terminated process supplying the activated fluorine-containing gas to the silicon-containing underfilm, the ends of the silicon-containing underfilm is reliably terminated with fluorine.

Working Example

Figure 13:
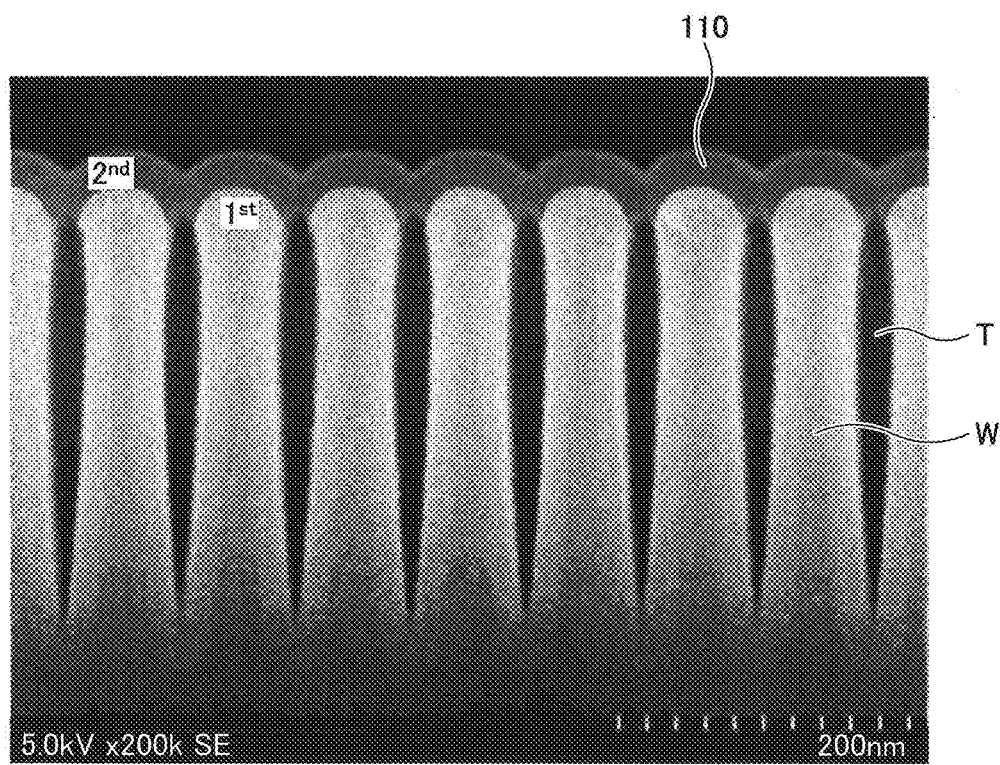
FIG. 13 is a diagram showing an experimental result of a protective film forming method of a working example of the present disclosure.

FIG. 13 is a diagram showing a result of a working example of the protective film forming method according to the first embodiment of the present disclosure. In the working example, a mixed gas of $ClF_3$/Ar was used as a fluorine-containing gas; dichlorosilane ($SiH_2Cl_2$) was used as the silicon-containing gas; and a mixed gas of $NH_3$/Ar was used as a nitriding gas. The remote plasma generator 90 was not used, and the protective forming method was performed according to the first embodiment.

As illustrated in FIG. 13, mushroom-shaped or cap-shaped protective films of SiN were selectively formed only on flat surfaces between multiple of trenches T and on top end portions of the trenches T. The SiN film was not formed on side surfaces below the top end portions.

Thus, the working example has indicated that the protective film forming method according to the embodiment of the present disclosure can form a protective film that can sufficiently satisfy a requirement of the process.

As discussed above, the protective film forming method according to the embodiments can selectively an regionally form a protective film on a region between recessed shapes such as a trench structure and a hole structure.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A protective film forming method, comprising steps of:
    causing an entire surface of a silicon-containing underfilm to be terminated with fluorine by supplying an activated fluorine-containing gas to the silicon-containing underfilm formed on a substrate having a surface including a plurality of recesses and a flat surface provided between the adjacent recesses, the substrate being provided in a process chamber;
    nitriding a surface of the silicon-containing underfilm formed on the flat surface of the substrate by supplying a nitriding gas converted to plasma to the silicon-containing underfilm terminated with fluorine such that a silicon adsorption site is formed on the surface of the silicon-containing underfilm formed on the flat surface of the substrate;
    adsorbing a silicon-containing gas on the silicon adsorption site by supplying the silicon-containing gas to the silicon-containing underfilm;
    changing a rotational speed of the turntable between the steps of causing the entire surface of the silicon-containing underfilm to be terminated with fluorine and nitriding the surface of the silicon-containing underfilm,
    wherein the substrate is arranged on a turntable along a circumferential direction thereof,
    wherein a fluorine-containing gas supply region configured to supply the activated fluorine-containing gas to the substrate, a silicon-containing gas supply region configured to supply the silicon-containing gas to the substrate, and a nitriding gas supply region configured to supply the nitriding gas to the substrate are arranged above the turntable, along the circumferential direction, and apart from each other,
    wherein the step of causing the entire surface of the silicon-containing underfilm to be terminated with fluorine is performed by stopping the supply of the silicon-containing gas in the silicon-containing gas supply region and the supply of the nitriding gas in the nitriding gas supply region and supplying the activated fluorine-containing gas to the substrate in the fluorine-containing gas supply region while rotating the turntable at least one time,
    wherein the step of nitriding the surface of the silicon-containing underfilm is performed by stopping the supply of the activated fluorine-containing gas in the fluorine-containing gas supply region and supplying the nitriding gas converted to the plasma in the nitriding gas supply region while rotating the turntable a plurality of times, and
    wherein the step of adsorbing the silicon-containing gas on the silicon adsorption site is performed by stopping the supply of the activated fluorine-containing gas in the fluorine-containing gas supply region and supplying the silicon-containing gas to the substrate in the silicon-containing gas supply region while rotating the turntable a plurality of times.

2. The protective film forming method according to claim 1, wherein the silicon adsorption site is also formed on inner side walls of the recesses at around top ends of the recesses.

3. The protective film forming method according to claim 1, further comprising:
    supplying a purge gas to the substrate between the steps of causing the silicon-containing underfilm to be terminated with fluorine and nitriding the surface of the silicon-containing underfilm and the steps of nitriding the surface of the silicon-containing underfilm and adsorbing the silicon-containing gas on the silicon adsorption site.

4. The protective film forming method according to claim 1, further comprising:
    depositing the silicon-containing underfilm on the surface of the substrate before the step of causing the entire surface of the silicon-containing underfilm to be terminated with fluorine.

5. The protective film forming method according to claim 1, wherein the step of causing the entire surface of silicon-containing underfilm to be terminated with fluorine comprises supplying the activated fluorine-containing gas while activating a fluorine-containing gas using a remote plasma generator.

6. The protective film forming method according to claim 1, wherein the step of nitriding the surface of the silicon-containing underfilm comprises supplying an ammonia-containing gas and a nitrogen-containing gas.

7. The film deposition method according to claim 1, wherein the recesses are trenches or via holes.

8. The protective film forming method according to claim 1, further comprising:
    repeating the steps of nitriding the surface of the silicon-containing underfilm and adsorbing the silicon-containing gas on the silicon adsorption site alternately a predetermined plurality of times until forming a protective film having a predetermined film thickness on the flat surface between the adjacent recesses after performing the step of causing the silicon-containing underfilm to be terminated with fluorine one time.

9. The protective film forming method according to claim 8,
    wherein the step of repeating the steps of nitriding the surface of the silicon-containing underfilm and adsorbing the silicon-containing gas on the silicon adsorption site alternately after performing the step of causing the silicon-containing underfilm to be terminated with fluorine one time is made one cycle, and
    wherein the one cycle is repeated a plurality of times.

10. The film deposition method according to claim 1,
    wherein the step of nitriding the surface of the silicon-containing underfilm is performed while supplying the silicon-containing gas to the substrate in the silicon-containing gas supply region, and
    wherein the step of adsorbing the silicon-containing gas on the silicon adsorption site is performed while supplying the nitriding gas converted to the plasma to the substrate in the nitriding gas supply region.

11. A protective film forming method, comprising steps of:
    causing an entire surface of a silicon-containing underfilm to be terminated with fluorine by supplying an activated fluorine-containing gas to the silicon-containing underfilm formed on a substrate having a surface including a plurality of recesses and a flat surface provided between the adjacent recesses, the substrate being provided in a process chamber;

nitriding a surface of the silicon-containing underfilm formed on the flat surface of the substrate by supplying a nitriding gas converted to plasma to the silicon-containing underfilm terminated with fluorine such that a silicon adsorption site is formed on the surface of the silicon-containing underfilm formed on the flat surface of the substrate; and adsorbing a silicon-containing gas on the silicon adsorption site by supplying the silicon-containing gas to the silicon-containing underfilm;

wherein the substrate is arranged on a turntable along a circumferential direction thereof, wherein a fluorine-containing gas supply region configured to supply the activated fluorine-containing gas to the substrate, a silicon-containing gas supply region configured to supply the silicon-containing gas to the substrate, and a nitriding gas supply region configured to supply the nitriding gas to the substrate are arranged above the turntable, along the circumferential direction, and apart from each other, wherein the step of causing the entire surface of the silicon-containing underfilm to be terminated with fluorine is performed by stopping the supply of the silicon-containing gas in the silicon-containing gas supply region and the supply of the nitriding gas in the nitriding gas supply region and supplying the activated fluorine-containing gas to the substrate in the fluorine-containing gas supply region while rotating the turntable at least one time, wherein the step of nitriding the surface of the silicon-containing underfilm is performed by stopping the supply of the activated fluorine-containing gas in the fluorine-containing gas supply region and supplying the nitriding gas converted to the plasma in the nitriding gas supply region while rotating the turntable a plurality of times, wherein the step of adsorbing the silicon-containing gas on the silicon adsorption site is performed by stopping the supply of the activated fluorine-containing gas in the fluorine-containing gas supply region and supplying the silicon-containing gas to the substrate in the silicon-containing gas supply region while rotating the turntable a plurality of times, and wherein the step of causing the entire surface of the silicon-containing underfilm to be terminated with fluorine is performed by rotating the turntable up to five times.

12. The protective film forming method according to claim 11, wherein the silicon adsorption site is also formed on inner side walls of the recesses at around top ends of the recesses.

13. The protective film forming method according to claim 11, further comprising:

supplying a purge gas to the substrate between the steps of causing the silicon-containing underfilm to be terminated with fluorine and nitriding the surface of the silicon-containing underfilm and the steps of nitriding the surface of the silicon-containing underfilm and adsorbing the silicon-containing gas on the silicon adsorption site.

14. The protective film forming method according to claim 11, further comprising:

depositing the silicon-containing underfilm on the surface of the substrate before the step of causing the entire surface of the silicon-containing underfilm to be terminated with fluorine.

15. The protective film forming method according to claim 11, wherein the step of causing the entire surface of silicon-containing underfilm to be terminated with fluorine comprises supplying the activated fluorine-containing gas while activating a fluorine-containing gas using a remote plasma generator.

16. The protective film forming method according to claim 11, wherein the step of nitriding the surface of the silicon-containing underfilm comprises supplying an ammonia-containing gas and a nitrogen-containing gas.

17. The film deposition method according to claim 11, wherein the recesses are trenches or via holes.

18. The protective film forming method according to claim 11, further comprising:

repeating the steps of nitriding the surface of the silicon-containing underfilm and adsorbing the silicon-containing gas on the silicon adsorption site alternately a predetermined plurality of times until forming a protective film having a predetermined film thickness on the flat surface between the adjacent recesses after performing the step of causing the silicon-containing underfilm to be terminated with fluorine one time.

19. The protective film forming method according to claim 18, wherein the step of repeating the steps of nitriding the surface of the silicon-containing underfilm and adsorbing the silicon-containing gas on the silicon adsorption site alternately after performing the step of causing the silicon-containing underfilm to be terminated with fluorine one time is made one cycle, and wherein the one cycle is repeated a plurality of times.

20. The film deposition method according to claim 11, wherein the step of nitriding the surface of the silicon-containing underfilm is performed while supplying the silicon-containing gas to the substrate in the silicon-containing gas supply region, and wherein the step of adsorbing the silicon-containing gas on the silicon adsorption site is performed while supplying the nitriding gas converted to the plasma to the substrate in the nitriding gas supply region.

* * * * *